United States Patent [19]

Sawada et al.

[11] Patent Number: 5,225,895

[45] Date of Patent: Jul. 6, 1993

[54] VELOCITY-MODULATION TRANSISTOR WITH QUANTUM WELL WIRE LAYER

[75] Inventors: Minoru Sawada; Kohji Matsumura; Daijiro Inoue, all of Hirakata, Japan

[73] Assignee: Sanyo Electric Co., Ltd., Moriguchi, Japan

[21] Appl. No.: 626,309

[22] Filed: Dec. 12, 1990

[30] Foreign Application Priority Data

Dec. 20, 1989 [JP] Japan ................................. 1-331608
Oct. 31, 1990 [JP] Japan ................................. 2-296435

[51] Int. Cl.[5] ..................... H01L 29/205; H01L 29/80
[52] U.S. Cl. ........................................ 257/256; 257/9; 257/12
[58] Field of Search ................................. 357/4, 16, 22

[56] References Cited

U.S. PATENT DOCUMENTS 4,899,201 2/1990 Xu et al. ................................. 357/22

FOREIGN PATENT DOCUMENTS 1-47078  2/1989 Japan ................................. 357/22
1238176  9/1989 Japan ................................. 357/22
1253970 10/1989 Japan ................................. 357/22

OTHER PUBLICATIONS

Velocity-Modulation Transistor (VMT)—A New Field-Effect Transistor Concept, Hiroyuki Sakaki, May 22, 1982.
Electron Effective-Mass Modulation Transistor, Y. Tokura & N. Susa, Nov. 7, 1989.

Primary Examiner—Jerome Jackson, Jr.
Attorney, Agent, or Firm—Morrison Law Firm

[57] ABSTRACT

An electron supply layer, a quantum well layer, a first barrier layer, a quantum well layer and a second barrier layer are formed in that order on a GaAs substrate to obtain a device, and source, drain and gate electrodes are provided on the surface of this device. In the above described quantum well layers, the lowest sub-band energies of respective carriers largely differ from each other. Accordingly, one of the above quantum well layers serves as a high-speed channel, and the other serves as a low-speed channel. The change in current value with the application of a gate bias depends only on the speed at which electrons move from the high-speed channel to the low-speed channel. Consequently, a velocity-modulation transistor can be constructed which operates at substantially high speed.

17 Claims, 6 Drawing Sheets

VELOCITY-MODULATION TRANSISTOR WITH QUANTUM WELL WIRE LAYER

BACKGROUND OF THE INVENTION

1. Field of the Invention

The present invention relates to a velocity-modulation transistor having a high-speed channel and a low-speed channel.

2. Description of the Prior Art

The channel conductance G of a field-effect transistor is given, in general, by the following equation:

$$G = qn\, \mu_{eff} \tag{1}$$

where q is the charge on carriers, n is the carrier concentration, and $\mu_{eff}$ is the effective carrier mobility of the carriers.

Generally, the channel conductance G is increased or decreased by changing a voltage applied to a gate of a transistor, to perform operations as a device such as an on-off operation of a source-drain current. The change in channel conductance $\Delta G$ relative to the change in gate bias $\Delta Vg$ is given by the following equation:

$$\Delta G = q\Delta n\, \mu_{eff} + qn\Delta\mu_{eff} \tag{2}$$

In a conventional field-effect transistor, the change in carrier concentration $\Delta n$ in the first term of the equation (2) contributes to $\Delta G$. Consequently, the operating speed of a device depends on the charging and discharging time of carriers. Accordingly, a high speed of less than 1 psec cannot be expected.

Therefore, a velocity-modulation transistor for operating a device by the second term of the above described equation (2), that is, the change in mobility $\Delta\mu_{eff}$ has been proposed in a document entitled "Velocity-Modulation Transistor", Japanese Journal Applied Physics, Vol. 21, No. Jun. 6, 1982, pp. 381–383. (A copy of this proposal accompanies this application).

The device proposed herein comprises a channel A (ch. A) in which carriers can move at high speed and a channel B (ch. B) in which carriers can move at low speed. The two channels have symmetrical potential shapes. Two gates, that is, a gate A and a back gate B are respectively provided in an upper part of the channel A (ch. A) and in a lower part of the channel B (ch. B) in order for the carriers to move between the channels. In this device, an operation of performing velocity modulation is obtained by changing a gate bias to change a channel in which carriers flow. In this case, the operating speed of the device is determined only by the time required for the carriers to move between the channels, thereby allowing a switching operation with a high speed of less than 1 psec.

However, the above described construction has the following problems.

First, the difference in speed between the channels A and B is caused by the difference in the amount of impurities in the channels. However, the scattering of the carriers due to the impurities is effective only at low temperatures, that is, at temperatures below the temperature of liquid nitrogen. Accordingly, there is little difference in speed at room temperature, so that the device does not operate at room temperature.

Second, the two channels have symmetrical potential shapes. Accordingly, the two gates, that is, the gate A and the back gate B are respectively required in the upper part of the channel A (ch. A) and in the lower part of the channel B (ch. B) in order for the carrier to move between the channels.

Third, when the device is on, that is, a steady-state current IL flows in the device, the device is in exactly the same internal state as that of an ordinary high electron mobility transistor (referred to as HEMT hereinafter), so that the power consumption thereof is the same as that of the ordinary HEMT. Consequently, a velocity-modulation transistor is not currently realized in the above described construction.

SUMMARY OF THE INVENTION

An object of the present invention is to provide a new velocity-modulation transistor which can operate at room temperature.

Another object of the present invention is to make it possible to perform operations such as on-off operation of a device using only one gate to simplify the construction of the device.

Still another object of the present invention is to provide a device whose power consumption is significantly small.

A further object of the present invention is to allow switching with a high speed of approximately 0.1 psec which is peculiar to a velocity-modulation transistor.

The velocity-modulation transistor according to the present invention is characterized by comprising a semiconductor substrate, an electron supply layer provided on the above substrate, a quantum well wire comprising an in-plane superlattice layer provided on the above electron supply layer, a first barrier layer provided on the above in-plane superlattice layer, a quantum well layer provided on the above first barrier layer, a second barrier layer provided on the above quantum well layer, a source electrode and a drain electrode which make ohmic contact with a region formed on the above first barrier layer, and a gate electrode which makes Schottky contact with the above second barrier layer.

According to the present invention, the carrier velocities in the quantum well wire layer having an in-plane superlattice structure and the quantum well layer differ from each other because of a large difference between the lowest sub-band energies of two layers. When the width of a barrier layer between superlattices which separates the quantum well wire of in-plane superlattice structure is considerably large, the carriers are confined in the quantum well wire, so that the carrier velocity in the quantum well wire channel becomes zero or is substantially close to zero. This operation also holds at room temperature. Consequently, the difference in velocity between both channels of the quantum well layer and the quantum well wire comprising the in-plane superlattice layer is increased, thereby allowing a high-speed operation even at room temperature.

The velocity-modulation transistor according to the present invention is characterized by comprising a semiconductor substrate, an electron supply layer provided on the above substrate, a quantum well wire provided on the above electron supply layer, a first barrier layer provided on the above quantum well wire, a quantum well layer provided on the above first barrier layer, a second barrier layer provided on the above quantum well layer, a source electrode and a drain electrode which make ohmic contact with a region formed on the above electron supply layer, and a gate electrode which makes Schottky contact with the above second barrier layer.

According to the present invention, the carrier velocities in the quantum well wire layer and the quantum well layer differ from each other because of a large difference between the lowest sub-band energies of two layers.

The carrier velocity in the channel of the quantum well wire having a one-dimensional quantum wire structure is higher than that in the quantum well layer serving as a two-dimensional channel.

Consequently, high-speed operation can be performed at room temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the present invention will be described with reference to FIGS. 1, 2 and 3.

Figure 1:
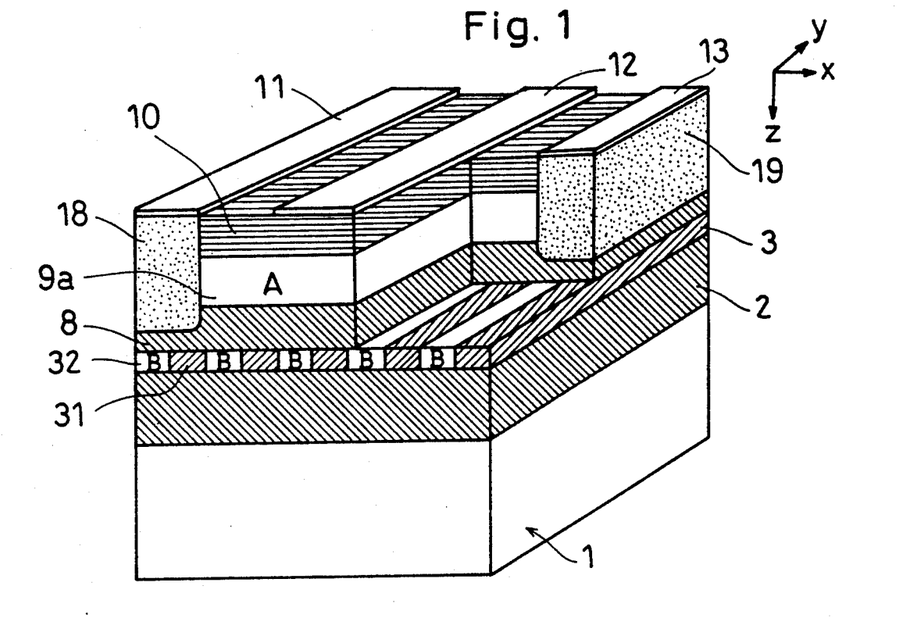
FIG. 1 is partially cutaway view in perspective showing a velocity-modulation transistor according to a first embodiment of the present invention.

FIG. 1 is a partially cutaway view in perspective showing the construction of a velocity-modulation transistor according to the present invention.

In the velocity-modulation transistor according to the present invention, an electron supply layer (2) composed of N-type AlGsAs, a quantum well wire (3) comprising an in-plane superlattice layer constituted by barrier layers (31) composed of AlAs and quantum wires (32) composed of GaAs, a first barrier layer (8) composed of AlGaAs, a quantum well layer (9a) composed of GaAs and a second barrier layer (10) composed of AlGaAs are laminated in that order on a GaAs substrate (1), as shown in FIG. 1. Further, a source electrode (11) and a drain electrode (13) make ohmic contact with contact regions (18) and (19) composed of n+-type GaAs formed on the barrier layer (8). A gate electrode (12) makes Schottky contact with the barrier layer (10).

The quantum wires (32) composed of GaAs in the lower quantum well wire layer (3) are surrounded by the electron supply layer (2) and the barrier layer (8) which are composed of AlGaAs in the z direction and the barrier layers (31) composed of AlAs in the x direction. Accordingly, one-dimensional quantum well wires are formed in the direction perpendicular to the source-drain direction and function as channels B.

On the other hand, the upper quantum well layer (9a) composed of GaAs is sandwiched between the barrier layers (8) and (10) composed of AlGaAs in the z direction and functions as a quantum well channel A.

The upper quantum well layer (9a) composed of GaAs is used as a high-speed channel A, and the lower quantum well wire layer (3) including the GaAs quantum wire are used as low-speed channels B.

The above described channels are separated by the barrier layer (8) composed of AlGsAs which is relatively thin, that is, where a tunnel phenomenon may occur. The thickness of the channel A is made larger than that of the channel B so as to make sub-band energy (energy in the lowest sub-band) of carriers in the channel A smaller than that in the channel B, for example.

Figure 2:
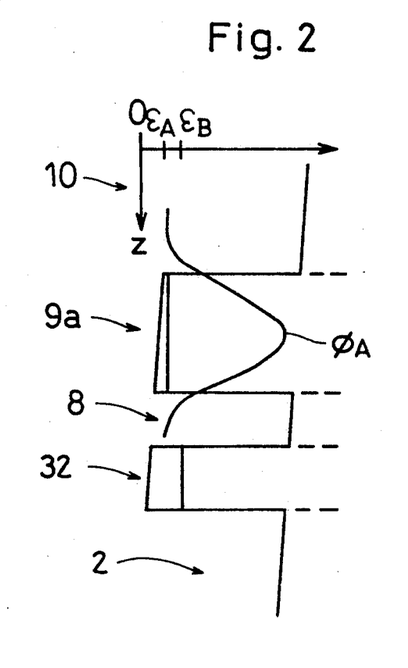
FIG. 2 is an energy band diagram of the velocity-modulation transistor shown in FIG. 1 when a gate bias (Vg) is zero.
Figure 3:
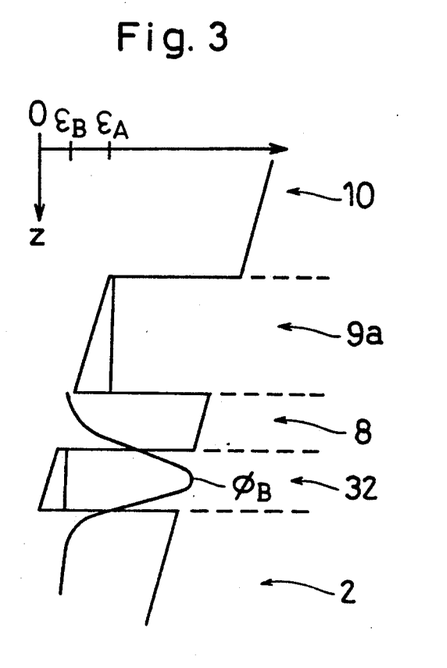
FIG. 3 is an energy band diagram of the velocity-modulation transistor shown in FIG. 1 when a gate bias (Vg) is negative.

If the thickness of the channel A is thus made larger than that of the channel B, sub-band energy $\epsilon_A$ in the channel A becomes smaller than sub-band energy $\epsilon_B$ in the channel B, as shown in energy band diagrams of FIGS. 2 and 3.

In FIGS. 2 and 3, the thickness of the channel A (9a) is 150 Å, the thickness of the channel B (32) is 80 Å, and the thickness of the barrier layer (8) composed of AlGaAs is 70 Å.

In a state A where $\epsilon_A < \epsilon_B$, electrons are distributed in the channel A, as represented by $\phi_A$ in FIG. 2. At this time, if a voltage is applied between the source (11) and the drain (13), a large current flows in the channel A.

Then, if a negative voltage is applied to the gate (12), a potential in the direction of the surface of the device is increased, so that the sub-band energy $\epsilon_B$ in the channel B becomes smaller than the sub-band energy $\epsilon_A$ in the channel A, as shown in FIG. 3.

At this time, electrons are distributed in the channel B, as represented by $\phi_B$. In addition, the carrier concentration hardly changes, so that the source-drain current is decreased due only to the low-speed properties of the channel B.

Meanwhile, the speed of the current response to the gate bias depends on only the speed at which electrons move from the channel A to the channel B, so that the properties with a substantially high speed of approximately 0.1 psec can be expected. Further, high-speed operation is similarly performed in a case where electrons move from the channel B to the channel A to increase the current value by the reverse change of the gate bias.

The operation of the velocity-modulation transistor according to the first embodiment will be further described.

In the channel B, the wires are formed in the direction perpendicular to the source-drain direction. Accordingly, if the size of the barrier layer (31) separating the quantum well wires (32) in the x direction is considerably large, carriers are confined in the quantum well wires (32). Consequently, the velocity of the carriers in the channel B becomes zero.

On the other hand, in the channel B, if the size of the barrier layer (AlAs layer) (31) in the x direction is small so that a mini band is formed, the carriers are expanded in a two-dimensional manner and the effective mass is increased. Consequently, the velocity of the carriers in the channel B is substantially reduced.

The foregoing also holds at room temperature. Consequently, the difference in carrier velocity between the channels A and B becomes large, thereby allowing high-speed operation at room temperature.

A second embodiment of the present invention will be described with reference to FIGS. 4, 5 and 6.

Figure 4:
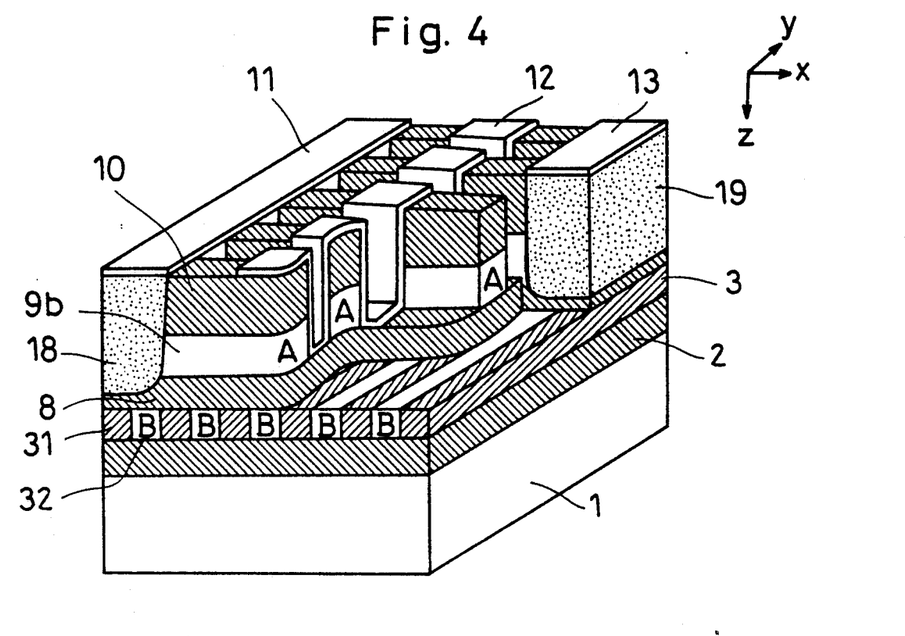
FIG. 4 is a partially cutaway view in perspective showing a velocity-modulation transistor according to a second embodiment of the present invention.

FIG. 4 is a partially cutaway view in perspective showing one example of the construction of a velocity-modulation transistor according to the second embodiment of the present invention.

The quantum well layer (9a) serving as the channel A is constituted by a uniform GaAs layer in the first embodiment, while a quantum well wire (9b) composed of GaAs is constituted by wires formed in the direction parallel to the source-drain direction in the second embodiment, as shown in FIG. 4.

Furthermore, lower quantum wires (32) composed of GaAs serve as one-dimensional quantum well wire channels B perpendicular to the source-drain direction, as described above.

On the other hand, the upper quantum well wire (9b) composed of GaAs is sandwiched between barrier layers (8) and (10) in the z direction and is formed to a small line width of several 100 Å, for example, by fine processing such as laser interference exposure followed by etching in the y direction, and functions as one-dimensional quantum well channels A parallel to the source-drain direction.

The upper quantum well wires (9b) are used as high-speed channels A, and the lower quantum wires (32) composed of GaAs perpendicularly intersecting the upper quantum well wire (9b) are used as low speed channels B. The above described channels are separated by the barrier layer (8) which is relatively thin, that is, where a tunnel phenomenon may occur. The thickness of the channel A is made larger than that of the channel B so as to make sub-band energy (energy in the lowest sub-band) of carriers in the channel A smaller than that in the channel B, for example.

Furthermore, only the channel A is set to such a line width that the carriers can run in a one-dimensional manner when the device is turned on, i.e., approximately less than 500 Å.

Meanwhile, it is assumed that the line widths of the channels A and B (the size of the channel A in the y direction, and the size of the channel B in the x direction) are equal to each other (for example, 150 Å). In this case, sub-band energy of electrons in the channel depends on the thickness of the channel (the size of the channel in the z direction).

Figures 5, 6:
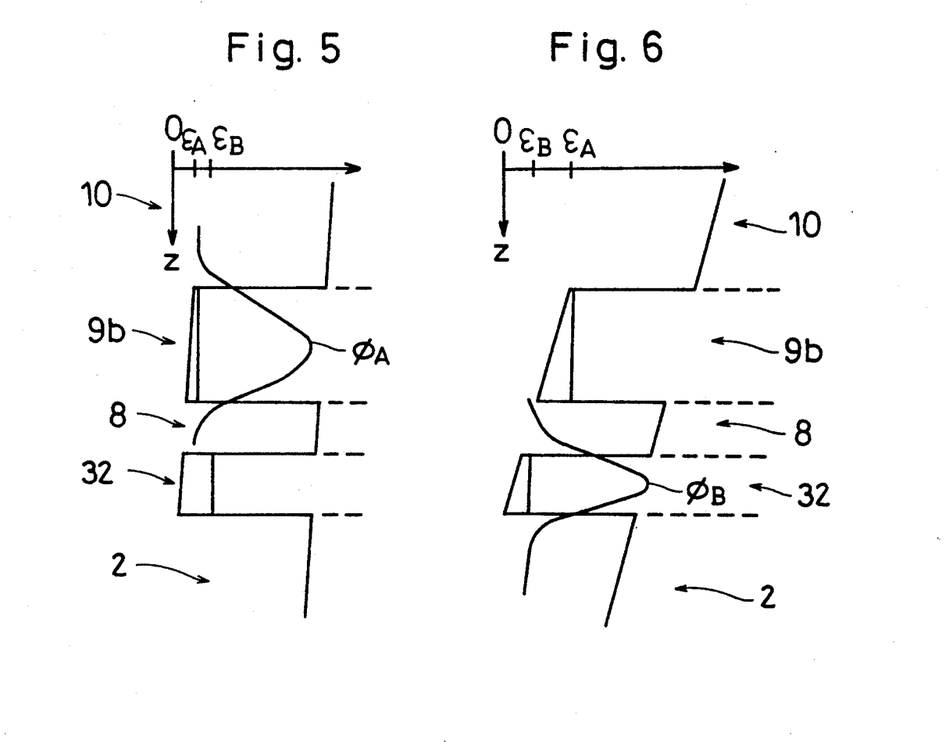
FIG. 5 is an energy band diagram of the velocity-modulation transistor shown in FIGS. 4 when a gate bias (Vg) is zero.
FIG. 6 is an energy band diagram of the velocity-modulation transistor shown in FIG. 4 when a gate bias (Vg) is negative.

For example, when the thickness of the channel A is made larger than that of the channel B, sub-band energy $\epsilon_A$ in the channel A becomes smaller than sub-band energy $\epsilon_B$ in the channel B, as shown in energy band diagrams in FIGS. 5 and 6.

In FIGS. 5 and 6, the thickness of the channel A (the quantum well GaAs layer (9b) is 150 Å, the thickness of the channel B (the GaAs layer (32)) is 80 Å, and the thickness of the barrier layer (8) composed of AlGaAs is 70 Å.

Thus, in a state A where $\epsilon_A < \epsilon_B$, electrons are distributed in the channel A, as represented by $\phi_A$ in FIG. 5.

At this time, if a voltage is applied between a source (11) and a drain (13), a larger current flows due to the high-speed properties of the channel A.

Then, if a negative voltage is applied to a gate (12), a potential in the direction of the surface of the device is increased, so that the sub-band energy $\epsilon_B$ in the channel B becomes smaller than the sub-band energy $\epsilon_A$ in the channel A, as shown in FIG. 6.

At this time, electrons are distributed in the channel B, as represented by $\phi_B$. In addition, the carrier concentration hardly changes, so that the source-drain current is decreased due to only the low-speed properties of the channel B.

Meanwhile, the speed of the current response on the gate bias depends on only the speed at which electrons move from the channel A to the channel B, so that the properties with a substantially high speed of approximately 0.1 psec can be expected. Furthermore, a high-speed operation is similarly performed in a case where electrons move from the channel B to the channel A to increase the current value by the reverse change of the gate bias.

Additionally, a large current value is also obtained by a small source-drain bias due to the high-speed properties of the channel A. Accordingly, the device operates with substantially low power consumption.

The operation of the velocity-modulation transistor according to the second embodiment of the present invention will be further described.

The carrier velocity in the channel A having a one-dimensional quantum wire structure is higher than that in a modulation doped heterojunction two-dimensional channel of an HEMT or the like.

On the other hand, in the channel B, if the size of a barrier layer (31) separating the quantum well wires (GaAs layers) (32) in the x direction is considerably large, carriers are confined in the quantum well wires (GaAs layers) (32). Consequently, the velocity of the carriers in the channel B becomes zero.

On the other hand, in the channel B, if the size of the barrier layer (AlAs layer) (31) in the x direction is small so that a mini band is formed, the carriers are expanded in a two-dimensional manner and the effective means is increased. Consequently, the velocity of the carriers in the channels B is significantly reduced.

The foregoing also holds at room temperature. Consequently, the difference in speed between the channels A and B becomes large, thereby allowing high-speed operation at room temperature.

Then, when the line width of the channel A (the size of the GaAs layer (9b) in the y direction) is equal to the line width of the channel B (the size of the GaAs layer (32) in the x direction), for example, the sub-band energy in the channel ($\epsilon_A$, $\epsilon_B$: FIGS. 5 and 6) depends on only the thickness of the channel (the size of the channel in the z direction) as described above.

When the thickness of the channel A is made larger than that of the channel B, the sub-band energy $\epsilon_A$ of the carriers in the channel A becomes smaller than the sub-band energy $\epsilon_B$ of the carriers in the channel B, as shown in FIG. 5. Consequently, the carriers are distributed in the channel A at this time.

Herein, $\phi_A$ denotes a wave function of the carriers in the channel A, and $|\phi_A|^2$ denotes the distribution of the carriers.

In this state, if a bias voltage is applied to the gate electrode (12), a potential on the side of the surface of the device is increased, so that the sub-band energy $\epsilon_B$ in the channel B becomes smaller than the sub-band energy $\epsilon_A$ in the channel A, as shown in FIG. 6. Accordingly, the carriers are distributed in the channel B.

Herein, $\phi_B$ denotes a wave function of the carriers in the channel B, and $|\phi_B|^2$ denotes the distribution of the carriers.

Thus, the carriers can be moved between the channels by only the gate electrode (12) on the surface of the device. Accordingly, no back gate is required.

Figure 13:
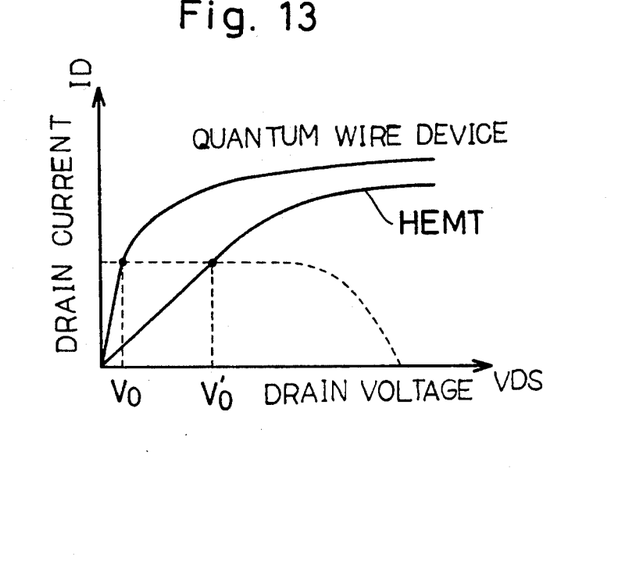
FIG. 13 is a diagram showing current-voltage characteristics of a drain.

Additionally, as shown in FIG. 13, the mobility in one-dimensional carrier conduction is larger than that in a two-dimensional system such as the HEMT. Particularly at low temperatures, the mobility is approximately 100 times that in the HEMT and the saturation velocity is two times or more that in the HEMT. Accordingly, in a case where a current IL having the same value flows when the device is turned on, a source-drain voltage VP3 can be made smaller than that in the HEMT or the like. Consequently, the power consumption is approximately one-tenth that in the ordinary HEMT structure.

A third embodiment of the present embodiment will be described with reference to FIGS. 7, 8 and 9.

Figure 7:
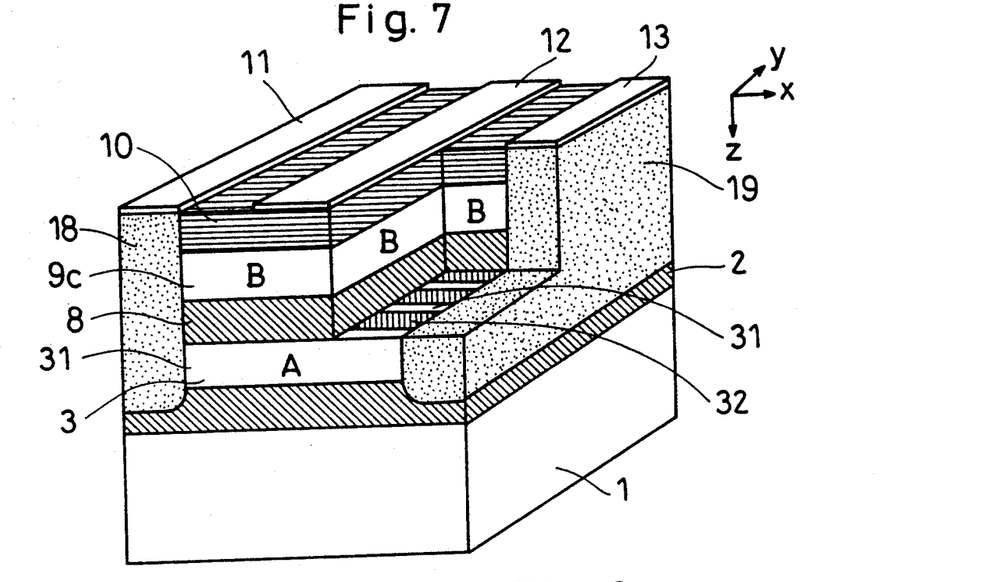
FIG. 7 is partially cutaway view in perspective showing a velocity-modulation transistor according to a third embodiment of the present invention.

FIG. 7 is a partially cutaway view in perspective showing the construction of a velocity-modulation transistor according to the present invention.

In the velocity-modulation transistor according to the present embodiment, an electron supply layer (2) composed of N-type AlGaAs, a quantum well wire (3) comprising an in-plane superlattice layer constituted by barrier layers (31) composed of AlAs and quantum wires (32) composed of GaAs, a first barrier layer (8) composed of AlGaAs, a quantum well layer (9c) composed of GaAs, and a second barrier layer (10) composed of AlGaAs are laminated in that order on a GaAs substrate (1), as shown in FIG. 7. Further, a source electrode (11) and a drain electrode (13) make ohmic contact with contact regions (18) and (19) composed of n+-type GaAs which are formed on the electron supply layer (2). A gate electrode (12) makes Schottky connection with the barrier layer (10).

The lower quantum wires (32) composed of GaAs are surrounded by the electron supply layer (2) and the barrier layer (8) which are composed of AlGaAs in the z direction and the barrier layers (31) composed of AlAs in the y direction. Accordingly, one-dimensional quantum well wires are formed in the direction parallel to the source-drain direction and function as channels A.

On the other hand, the upper quantum well layer (9c) composed of GaAs is sandwiched between the barrier layers (8) and (10) which are composed of AlGaAs in the z direction and functions as a two-dimensional quantum well channel B.

The lower quantum wires (32) composed of GaAs are used as high-speed channels A, and the upper quantum well layer (9c) is used as a low-speed channel B. Both the above described channels are separated by the barrier layer (8) composed of AlGaAs which is relatively thin, that is, where a tunnel phenomenon may occur. The thickness of the channel A is made larger than that of the channel B so as to make sub-band energy (energy in the lowest sub-band) of carriers in the channel A smaller than that in the channel B, for example.

Figure 8:
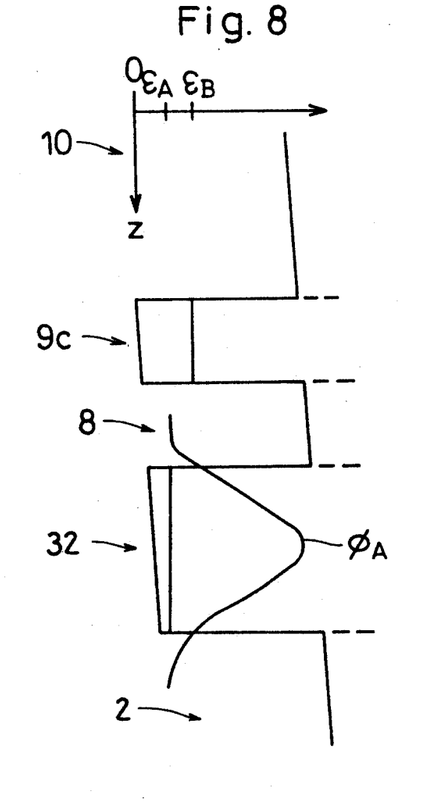
FIG. 8 is an energy band diagram of the velocity-modulation transistor shown in FIG. 7 when a gate bias (Vg) is zero.
Figure 9:
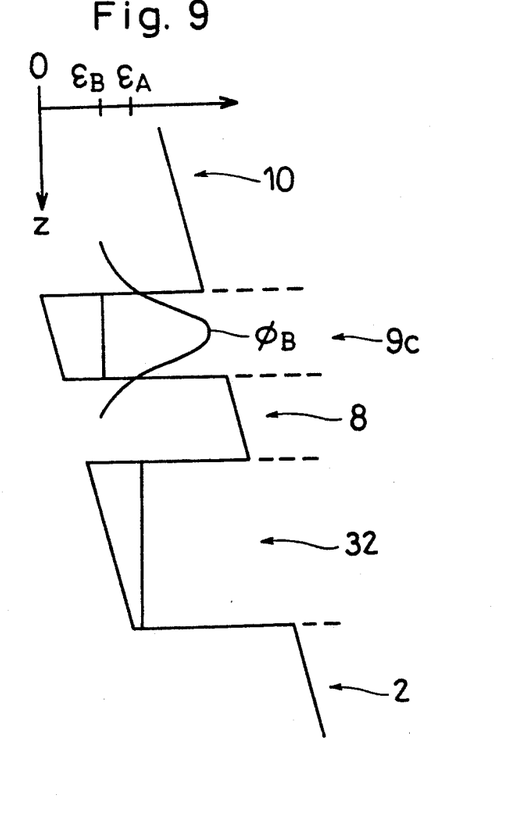
FIG. 9 is an energy band diagram of the velocity-modulation transistor shown in FIG. 7 when a gate bias (Vg) is positive.

If the thickness of the channel A is thus made larger than that of the channel B, sub-band energy $\epsilon_A$ in the channel A becomes smaller than sub-band energy $\epsilon_B$ in the channel B, as shown in energy band diagrams of FIGS. 8 and 9.

In FIGS. 8 and 9, the thickness of the channel A (32) is 150Å, the thickness of the channel B (9c) is 80Å, and the thickness of the barrier layer (8) composed of AlGaAs is 70Å.

Thus, in the state A where $\epsilon_A < \epsilon_B$, electrons are distributed in the channel A, as represented by $\phi_A$.

At this time, if a voltage is applied between the source (11) and the drain (13), a large current flows due to the high-speed properties of the channel A.

Then, if a positive voltage is applied to the gate (12), a potential in the direction of the surface of the device is increased, so that the sub-band energy $\epsilon_B$ in the channel B becomes smaller than the sub-band energy $\epsilon_A$ in the channel A, as shown in FIG. 9.

At this time, electrons are distributed in the channel B, as represented by $\phi_B$. In addition, the carrier concentration hardly changes, so that the source-drain current is decreased due to only the low-speed properties of the channel B.

Meanwhile, the speed of the current response on the gate bias depends only on the speed at which electrons move from the channel A to the channel B, so that the properties with a substantially high speed of approximately 0.1 psec can be expected. In addition, high-speed operation is similarly performed in a case where electrons move from the channel B to A to increase the current value by the reverse change of the gate bias.

The operation of the velocity-modulation transistor according to the third embodiment will be further described.

The carrier velocity in the channel A having a one-dimensional quantum wire structure is higher than that in a modulation doped heterojunction two-dimensional channel of an HEMT or the like.

The channel B comprises a two-dimensional channel and thus, the carrier velocity therein is much lower than that in a one-dimensional channel.

A fourth embodiment of the present invention will be described with reference to FIGS. 10, 11 and 12.

Figure 10:
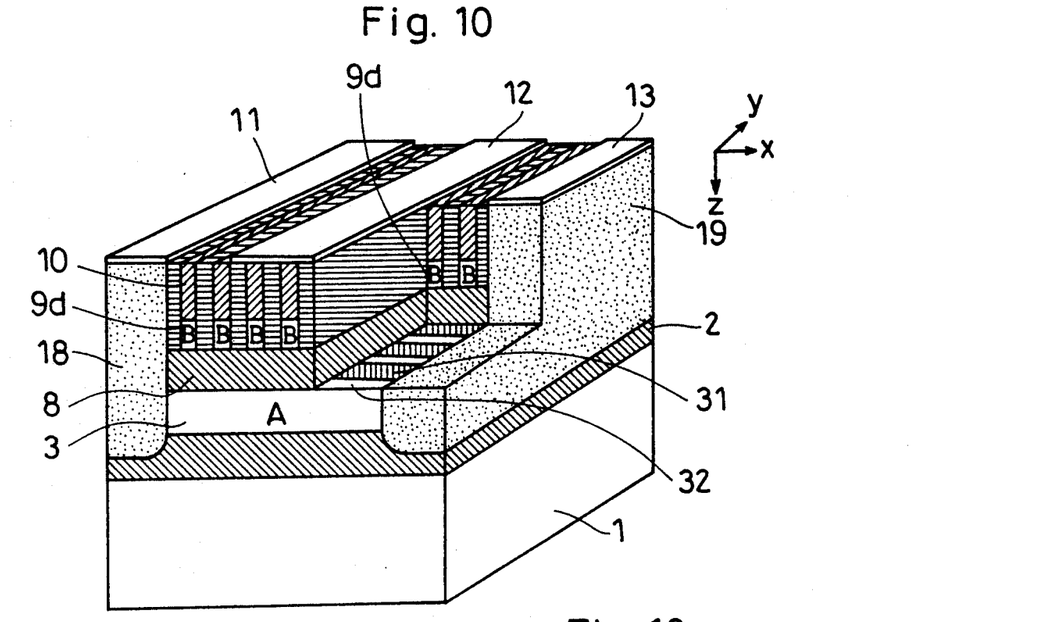
FIG. 10 is a partially cutaway view in perspective showing a velocity-modulation transistor according to a fourth embodiment of the present invention.

FIG. 10 is a partially cutaway view in perspective showing one example of the construction of a velocity-modulation transistor according to the fourth embodiment of the present invention.

The quantum well layer (9c) serving as the channel B is constituted by a uniform GaAs layer in the third embodiment, while a quantum well wire (9d) composed of GaAs is constituted by wires formed in the direction perpendicular to the source-drain direction in the fourth embodiment, as shown in FIG. 10.

Lower quantum wires (32) composed of GaAs serve as one-dimensional quantum well wire channels A parallel to the source-drain direction, as described above.

On the other hand, the upper quantum well wire (9d) composed of GaAs is sandwiched between barrier layers (8) and (10) in the z direction and is formed to a small line width of several 100Å, for example, by fine processing such as separation by focused ion beam, and functions as one-dimensional quantum well channels B perpendicular to the source-drain direction.

Quantum well wires constituting the lower quantum well wire layer (32) are used as high-speed channels A, and quantum well wires constituting the upper quantum well wire layer (9d) composed of GaAs perpendicularly intersecting the lower quantum well wires (32) are used as low-speed channels B. The above described channels are separated by the barrier layer (8) which is relatively thin, that is, where a tunnel phenomenon may occur. The thickness of the channel A is made larger than that of the channel B so as to make sub-band energy (energy in the lowest sub-band) of carriers in the channel A smaller than that in the channel B, for example.

Furthermore, only the channel A is set to such a line width that the carriers can run in a one-dimensional manner when the device is turned on, i.e., approximately less than 500Å.

Meanwhile, it is assumed that the line widths of the channels A and B (the size of the channel A in the y direction, and the size of the channel B in the x direction) are equal to each other (for example, 150Å). In this case, sub-band energy of electrons in the channel depends on the thickness of the channel (the size of the channel in the z direction).

Figure 11:
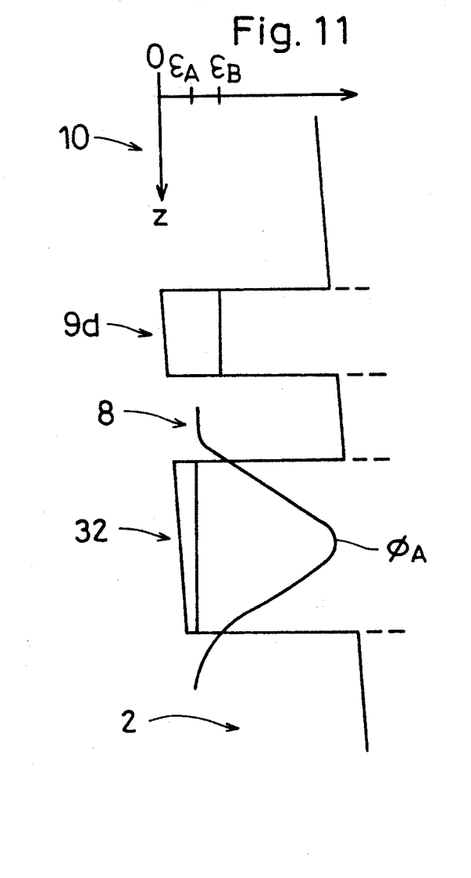
FIG. 11 is an energy band diagram of the velocity-modulation transistor shown in FIG. 10 when a gate bias (Vg) is zero.
Figure 12:
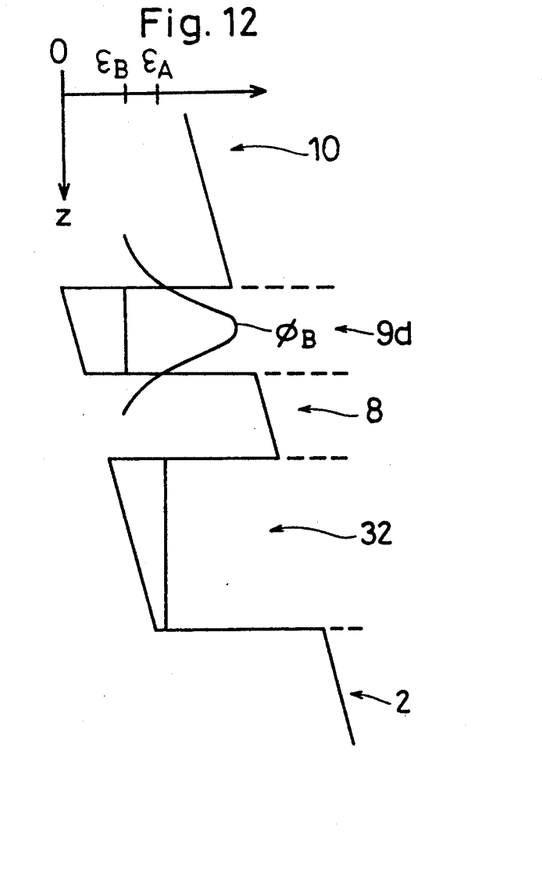
FIG. 12 is an energy band diagram of the velocity-modulation transistor shown in FIG. 10 when a gate bias (Vg) is positive.

For example, when the thickness of the channel A is made larger than that of the channel B, sub-band energy $\epsilon_A$ in the channel A becomes smaller than sub-band energy $\epsilon_B$ in the channel B, as shown in energy band diagrams of FIGS. 11 and 12.

In FIGS. 11 and 12, the thickness of the channel A (the quantum well GaAs layer (32)) is 150Å, the thickness of the channel B (the GaAs layer (9d)) is 80Å, and the thickness of the barrier layer (8) composed of AlGaAs is 70Å.

Thus, in a state A where $\epsilon_A < \epsilon_B$, electrons are distributed in the channel A, as represented by $\phi_A$.

At this time, if a voltage is applied between a source (11) and a drain (13), a large current flows due to the high-speed properties of the channel A.

Then, if a positive voltage is applied to a gate (12), a potential in the direction of the surface of the device is increased, so that the sub-band energy $\epsilon_B$ in the channel B becomes smaller than the sub-band energy $\epsilon_A$ in the channel A, as shown in FIG. 12.

At this time, electrons are distributed in the channel B, as represented by $\phi_B$. In addition, the carrier concentration hardly changes, so that the source-drain current is decreased due to only the low-speed properties of the channel B.

Meanwhile, the speed of the current response on the gate bias depends on only the speed at which electrons move from the channel A to the channel B, so that the properties with a substantially high speed of approximately 0.1 psec can be expected. Furthermore, a high-speed operation is similarly performed in a case where electrons move from the channel B to the channel A to increase the current value by the reverse change of the gate bias.

Additionally, a large current value is also obtained by a small source-drain voltage due to the high-speed properties of the channel A. Accordingly, the device operates with substantially low power consumption.

The operation of the velocity-modulation transistor according to the fourth embodiment of the present invention well be further described.

The carrier velocity in the channel A having a one-dimensional quantum wire structure is higher than that in a selective doped heterojunction two-dimensional channel of an HEMT or the like.

On the other hand, in the channel B, if the size of a barrier layer separating the quantum well wire (GaAs layer) (9d) in the x direction is considerably large, carriers are confined in the quantum well wire (GaAs layer) (9d). Consequently, the velocity of the carriers in the channel B becomes zero.

On the other hand, in the channel B, if the size of the barrier layer (AlAs layer) in the x direction is small so that a mini band is formed, the carriers are expanded in a two-dimensional manner and the effective mass is increased. Accordingly, the velocity of the carriers is substantially reduced.

The foregoing also holds at room temperature. Consequently, the difference in speed between the channels A and B becomes large, thereby allowing high-speed operation at room temperature.

Then, when the line width of the channel A (the size of the GaAs layer (32) in the y direction) is equal to the line width of the channel B (the size of the GaAs layer (9d) in the x direction), for example, the sub-band energy in the channel ($\epsilon_A$, $\epsilon_B$: FIGS. 11 and 12) depends on only the thickness of the channel (the size of the channel in the z direction).

When the thickness of the channel A is made larger than that of the channel B, the sub-band energy $\epsilon_A$ in the channel A becomes smaller than the sub-band energy $\epsilon_B$ in the channel B, as shown in FIG. 11. Consequently, the carriers are distributed in the channel A at this time.

Herein, $\phi_A$ denotes a wave function of the carriers in the channel A, and $|\phi_A|^2$ denotes the distribution of the carriers.

In this state, if a bias voltage is applied to the gate electrode (12), a potential on the side of the surface of the device is increased, so that the sub-band energy $\epsilon_B$ in the channel B becomes smaller than the sub-band energy $\epsilon_A$ in the channel A, as shown in FIG. 12. Accordingly, the carriers are distributed in the channel B.

Herein, $\phi_B$ denotes a wave function of the carriers in the channel B, and $|\phi_B|^2$ denotes the distribution of the carriers.

Thus, the carriers can move between the channels by only the gate electrode (12) provided on the surface of the device. Accordingly, no back gate is required.

Furthermore, as shown in FIG. 13, the mobility in one-dimensional carrier conduction is larger than that in a two-dimensional system such as the HEMT. Particularly at low temperatures, the mobility is approximately 100 times that in the HEMT and the saturation velocity is two times or more that in the HEMT. Accordingly, in a case where a current $I_L$ having the same value flows when the device is turned on, a source-drain voltage $V_{P3}$ can be made smaller than that in the HEMT or the like. Consequently, the power consumption is approximately one-tenth that in the ordinary HEMT structure.

Meanwhile, the present invention is not limited to the above described embodiments and a combination of structures of the channels can be altered. For example, the high-speed channel A located on the upper layer may be constituted by a high-speed quantum wire and the low-speed channel B located on the lower layer may be constituted by a uniform layer. Contrary to this, the low-speed channel B located on the upper layer may be constituted by a uniform layer and the high-speed channel A located on the lower layer may be constituted by a high-speed quantum wire. In this case, the high-speed quantum wire means that wires are formed in the direction parallel to the source-drain direction, and the low-speed quantum wire means that wires are formed in the direction perpendicular to the source-drain direction.

Additionally, the above described quantum well wire can be manufactured by the following techniques.

(a) a technique for forming in-plane superlattices by crystal growth.

(b) a focused ion-beam technique for forming barrier layers by implantation of Ga ions.

(c) a selective crystal growth technique using a mask for making crystal growth to an opening of a SiO$_2$ film or the like.

(d) a selective crystal growth technique using a laser operation for making crystal growth to only a laser irradiated area.

(e) an etching technique.

The quantum well wire located on the upper layer can use all the above described techniques, while the quantum well wire located on the lower layer uses the above described techniques (a) and (b).

Examples of combinations of the above described channels and manufacturing techniques are shown in the following.

(1) In a case where the channel on the upper layer is constituted by a high-speed quantum wire and the channel on the lower layer is constituted by a low-speed quantum wire.

TABLE 1

| upper layer | B | C | D | E | A | B | C | D | E |
|---|---|---|---|---|---|---|---|---|---|
| lower layer | A | A | A | A | B | B | B | B | B |

(2) In a case where the channel on the upper layer is constituted by a high-speed quantum wire and the channel on the lower layer is constituted by a uniform layer.

TABLE 2

| upper layer | A | B | C | D | E |
|---|---|---|---|---|---|
| lower layer | | | crystal growth (MOCVD) | | |

(3) In a case where the channel on the upper layer is constituted by a uniform layer and the channel on the lower layer in constituted by a low-speed quantum wire.

TABLE 3

| upper layer | crystal growth (MOCVD) | |
|---|---|---|
| lower layer | A | B |

(4) In a case where the channel on the upper layer is constituted by a low-speed quantum wire and the channel on the lower layer is constituted by a high-speed quantum wire.

TABLE 4

| upper layer | B | A | B |
|---|---|---|---|
| lower layer | A | B | B |

(5) In a case where the channel on the upper layer is constituted by a uniform layer and the channel on the lower layer is constituted by a high speed-quantum wire.

TABLE 5

| upper layer | crystal growth (MOCVD) | |
|---|---|---|
| lower layer | A | B |

(6) In a case where the channel on the upper layer is constituted by a low-speed quantum wire and the channel on the lower layer is constituted by a uniform layer.

TABLE 6

| upper layer | A | B |
|---|---|---|
| lower layer | crystal growth (MOCVD) | |

Figure 14:
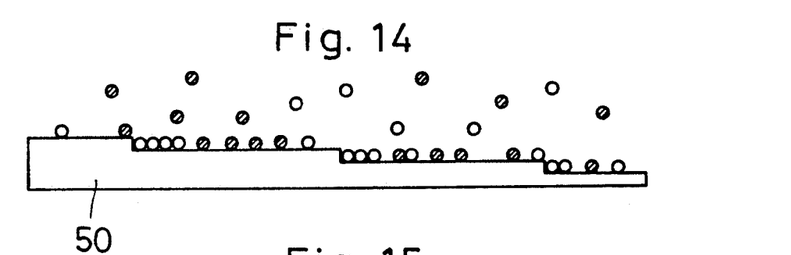
FIGS. 14, 15 and 16 are typical diagrams for explaining one example of the manufacture of a quantum well wire used in the present invention.

The technique (a) for forming a quantum well wire comprising in-plane superlattices by crystal growth out of the above described manufacturing techniques will be described with reference to FIGS. 14, 15 and 16.

The quantum well wire comprising in-plane superlattices is formed by, for example, an MOCVD technique under the conditions, that is, a growth temperature of 600° C. and a growth rate of 0.5 A/s. AsH$_3$, Ga(C$_2$H$_5$)$_3$ and Al(C$_2$H$_5$)$_3$ are used as material gases, and the Group III materials are alternately switched three seconds at a time. As shown in FIG. 14, a crystal tilted at several degrees in the direction [110] of a GaAs plane (110) is used as an underlying crystal (50).

Figure 15:
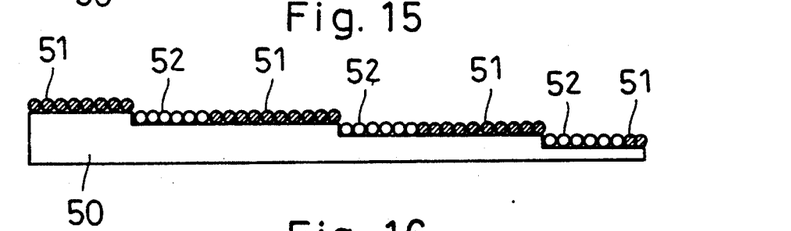
Figure 16:
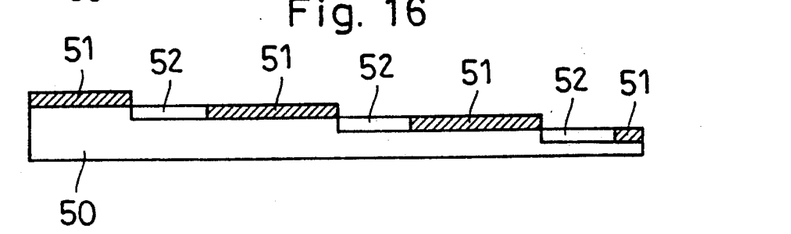

As shown in FIG. 15, atoms which reached the surface of the crystal are sequentially grown as a crystal by in-plane growth (line-by-line growth) from steps without forming a two-dimensional nucleus.

This operation is repeated, thereby to form an in-plane superlattice layer composed of AlAs (51) and GaAs (52), whose period is 16 nm corresponding to step intervals from a substrate tilted at an angle of 1°.

Furthermore, although in the examples shown in FIGS. 4 and 10, the quantum wire A on the upper layer is formed by fine processing techniques such as etching, a method of forming barrier layers using a focused ion beam technique, and a method of forming channels using a selective growth technique may be used.

Meanwhile, in order to change the potential energies of electrons in the channels A and B, several methods are known in addition to the above described method of changing the thicknesses of channels. For example, the line widths of the channels may be changed with the thicknesses of the channels being the same, in which case the same effect is obtained.

Figure 17:
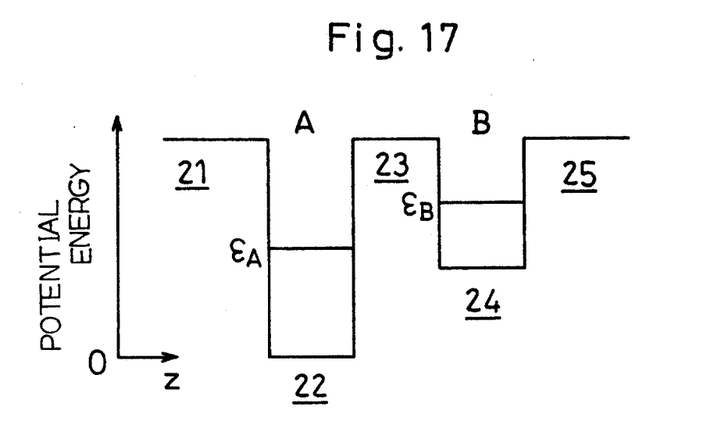
FIGS. 17, 18 and 19 are energy band diagrams in the vicinities of channels A and B.
Figure 18:
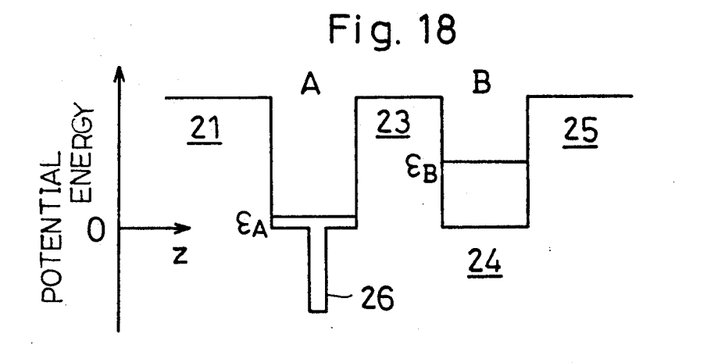

Additionally, the following methods are known. For example, materials of the channels A and B are changed as shown in FIG. 17. A potential well 26 made of a material with a smaller band gap than that of the channel A is inserted into the central part of the channel A, as shown in FIG. 18. A potential barrier 27 made of a material with a larger band gap than that of the channel B is inserted into the central part of the channel B, as shown in FIG. 19.

Figure 19:
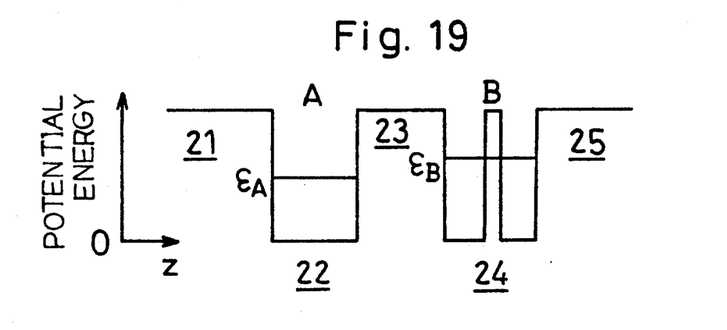

In FIGS. 17, 18 and 19, the channel A is indicated by a well layer 22, and the channel B is indicated by a well layer 24. Both the well layers 22 and 24 are separated by barrier layers 21, 23 and 25.

An example of combinations of materials for achieving the method of changing the widths of the channels and the methods shown in FIGS. 17, 18 and 19 is shown in the following table. Combinations of above described methods and the method shown in the following table are effective.

TABLE 7

| | barrier layer | well layer (channel A) | well layer (channel B) | insertion type potential well | insertion type potential barrier |
|---|---|---|---|---|---|
| substrate | 21, 23, 25 | 22 | 24 | 26 | 27 |
| (a) GaAs | AlGaAs | InGaAs | GaAs | | |
| GaAs | Al$_x$Ga$_{1-x}$As | GaAs | Al$_y$Ga$_{1-y}$As (x > y) | | |
| InP | InAlAs | InGaAs | InAlGaAs | | |
| (b) GaAs | AlGaAs | GaAs, InGaAs | GaAs, InGaAs | GaAs, InGaAs | |
| InP | InAlAs | InGaAs | InGaAs | GaAs, InGaAs | |
| (c) GaAs | AlGaAs | GaAs InGaAs | GaAs InGaAs | | AlGaAs |
| InP | InAlAs | InGaAs | InGaAs | | InAlAs |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A velocity-modulation transistor comprising:
   a semiconductor substrate;
   an electron supply layer provided on said substrate;
   a quantum well wire comprising an in-plane superlattice layer provided on said electron supply layer;
   a first barrier layer provided on said in-plane superlattice layer;
   a quantum well layer provided on said first barrier layer;
   a second barrier layer provided on said quantum well layer;
   a source electrode and a drain electrode which make ohmic contact with a region formed on said first barrier layer; and
   a gate electrode which makes Schottky contact with said second barrier layer.

2. The velocity-modulation transistor according to claim 1, wherein in said quantum well wire, one-dimensional quantum wires are formed in the direction perpendicular to the source-drain direction.

3. The velocity-modulation transistor according to claim 1, wherein said first barrier layer has a thickness effective to permit a tunnel phenomenon to occur between said quantum well wire and said quantum well layer.

4. The velocity-modulation transistor according to claim 1, wherein the lowest sub-band energies of carriers in said quantum well layer and said quantum well wire differ from each other.

5. The velocity-modulation transistor according to claim 1, wherein said quantum well layer has a one-dimensional quantum well wire structure.

6. The velocity-modulation transistor according to claim 5, wherein in said quantum well wire layer, one-dimensional wires are formed in the direction parallel to the source-drain direction.

7. The velocity-modulation transistor according to claim 6, wherein the wires in said quantum well layer and said quantum well wire are disposed perpendicularly to each other.

8. The velocity-modulation transistor according to claim 6, wherein said first barrier layer has a thickness effective to permit a tunnel phenomenon to occur between said quantum well wire and said quantum well layer.

9. The velocity-modulation transistor according to claim 6, wherein the width of the quantum well wire is set to approximately to 500 Å.

10. A velocity-modulation transistor comprising:
    a semiconductor substrate;
    an electron supply layer provided on said substrate;
    a quantum well wire layer provided on said electron supply layer;
    a first barrier layer provided on said quantum well wire layer;
    a quantum well layer provided on said first barrier layer;
    a second barrier layer provided on said quantum well layer;
    a source electrode and a drain electrode which make ohmic contact with a region formed on said electron supply layer;
    a gate electrode which makes Schottky contact with said second barrier layer; and
    said quantum well wire layer includes one-dimensional quantum wires disposed in a direction parallel to a source-drain direction.

11. The velocity-modulation transistor according to claim 10, wherein said first barrier layer includes a thickness effective to permit a tunnel phenomenon to occur between said quantum well wire and said quantum well layer.

12. The velocity-modulation transistor according to claim 10, the lowest sub-band energies of carriers in said quantum well layer and said quantum well wire differ from each other.

13. The velocity-modulation transistor according to claim 10, wherein said quantum well layer has a one-dimensional quantum well wire structure.

14. A velocity modulation transistor comprising:
    a semiconductor substrate;
    an electron supply layer provided on said substrate;
    a quantum well wire layer provided on said electron supply layer;
    a first barrier layer provided on said quantum well wire layer;
    a quantum well layer provided on said first barrier layer;

a second barrier layer provided on said quantum well layer;

a source electrode and a drain electrode which make ohmic contact with a region formed on said electron supply layer;

a gate electrode which makes Schottky contact with said second barrier layer;

said quantum well layer includes a one-dimensional quantum well wire structure; and in said quantum well wire layer, one-dimensional quantum wires are formed in the direction perpendicular to the source-drain direction.

15. The velocity-modulation transistor according to claim 13, wherein the wires in said quantum well layer and said quantum well wire are disposed perpendicularly to each other.

16. The velocity-modulation transistor according to claim 13, wherein said first barrier layer includes a thickness effective to permit a tunnel phenomenon to occur between said quantum well wire and said quantum well layer.

17. The velocity-modulation transistor according to claim 10, wherein the width of the quantum well wire is set to approximately 500 Å.

* * * * *